United States Patent
Rohrmann et al.

(10) Patent No.: US 9,587,306 B2
(45) Date of Patent: Mar. 7, 2017

(54) METHOD FOR PRODUCING A DIRECTIONAL LAYER BY CATHODE SPUTTERING, AND DEVICE FOR IMPLEMENTING THE METHOD

(75) Inventors: Hartmut Rohrmann, Schriesheim (DE); Hanspeter Friedli, Felsberg (CH); Jürgen Weichart, Balzers (LI); Stanislav Kadlec, Praha (CZ); Martin Dubs, Maienfeld (CH)

(73) Assignee: EVATEC AG, Trubbach (CH)

( * ) Notice: Subject to any disclaimer, the term of this patent is extended or adjusted under 35 U.S.C. 154(b) by 629 days.

(21) Appl. No.: 11/968,300

(22) Filed: Jan. 2, 2008

(65) Prior Publication Data
US 2009/0134011 A1 May 28, 2009

Related U.S. Application Data

(60) Provisional application No. 60/883,086, filed on Jan. 2, 2007.

(51) Int. Cl.
  C23C 14/34 (2006.01)
  G11B 5/851 (2006.01)
  H01J 37/34 (2006.01)

(52) U.S. Cl.
  CPC .............. *C23C 14/34* (2013.01); *G11B 5/851* (2013.01); *H01J 37/34* (2013.01); *H01J 37/3447* (2013.01)

(58) Field of Classification Search
  USPC ......................................... 204/192.2, 298.11
  See application file for complete search history.

(56) References Cited

U.S. PATENT DOCUMENTS

| | | | | |
|---|---|---|---|---|
| 5,415,753 A | * | 5/1995 | Hurwitt et al. | 204/192.12 |
| 5,584,973 A | | 12/1996 | Wada et al. | |
| 5,616,218 A | * | 4/1997 | Alex | 204/192.15 |
| 5,650,052 A | * | 7/1997 | Edelstein et al. | 204/192.12 |
| 5,885,425 A | * | 3/1999 | Hsieh et al. | 204/192.12 |
| 5,958,193 A | * | 9/1999 | Brugge | 204/192.13 |

(Continued)

FOREIGN PATENT DOCUMENTS

| | | |
|---|---|---|
| JP | 11-200029 A | 7/1999 |
| WO | 9608817 A1 | 3/1996 |
| WO | 2007085549 A2 | 8/2007 |

OTHER PUBLICATIONS

International Search Report dated Mar. 12, 2008.

*Primary Examiner* — John Brayton
(74) *Attorney, Agent, or Firm* — Pearne & Gordon LLP

(57) ABSTRACT

For producing a directional layer for instance with constant nominal directionality, such as a low-retentivity layer with a preferred direction of magnetization or a support layer for such a layer by cathode sputtering on a substrate surface (4), the coating process takes place in a manner whereby particles emanating from a target surface (6) impinge predominantly from directions whose projections onto the substrate surface (4) lies within a preferred angular range surrounding the nominal direction. This is achieved for instance by positioning a collimator (8), encompassing plates (9) that extend at a normal angle to the substrate surface (4) parallel to the nominal direction in front of the substrate surface (4), but in lieu of or in addition to such positioning the location or movement of the substrate surface (4) relative to the target surface (6) can also be suitably adjusted or controlled.

15 Claims, 3 Drawing Sheets

(56) References Cited

U.S. PATENT DOCUMENTS

| | | |
|---|---|---|
| 6,482,301 B1 | 11/2002 | Chen et al. |
| 6,743,340 B2 * | 6/2004 | Fu .......................... 204/192.12 |
| 6,790,482 B2 | 9/2004 | Maass |
| 7,294,242 B1 * | 11/2007 | Hashim et al. ............ 204/192.2 |
| 2003/0019745 A1 | 1/2003 | Wang et al. |
| 2003/0062260 A1 | 4/2003 | Furukawa et al. |
| 2003/0146084 A1 | 8/2003 | Fu |
| 2010/0242578 A1 | 9/2010 | Link et al. |

* cited by examiner

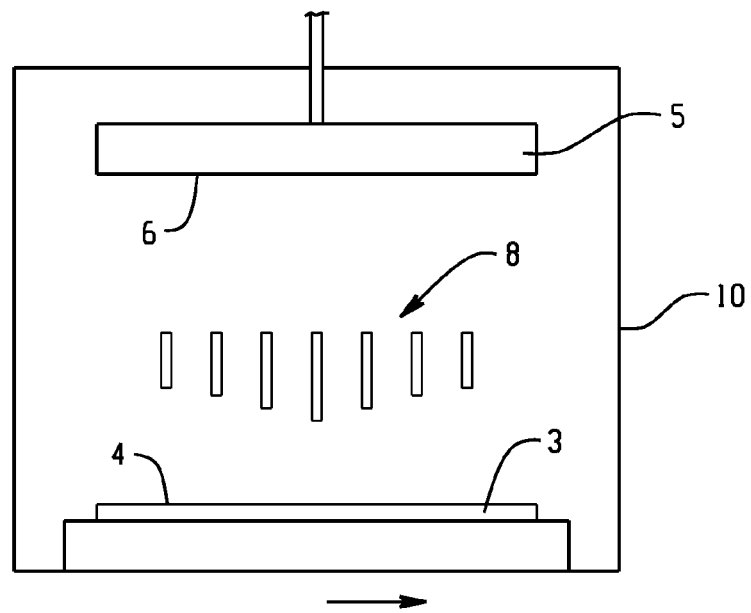
Fig. 4
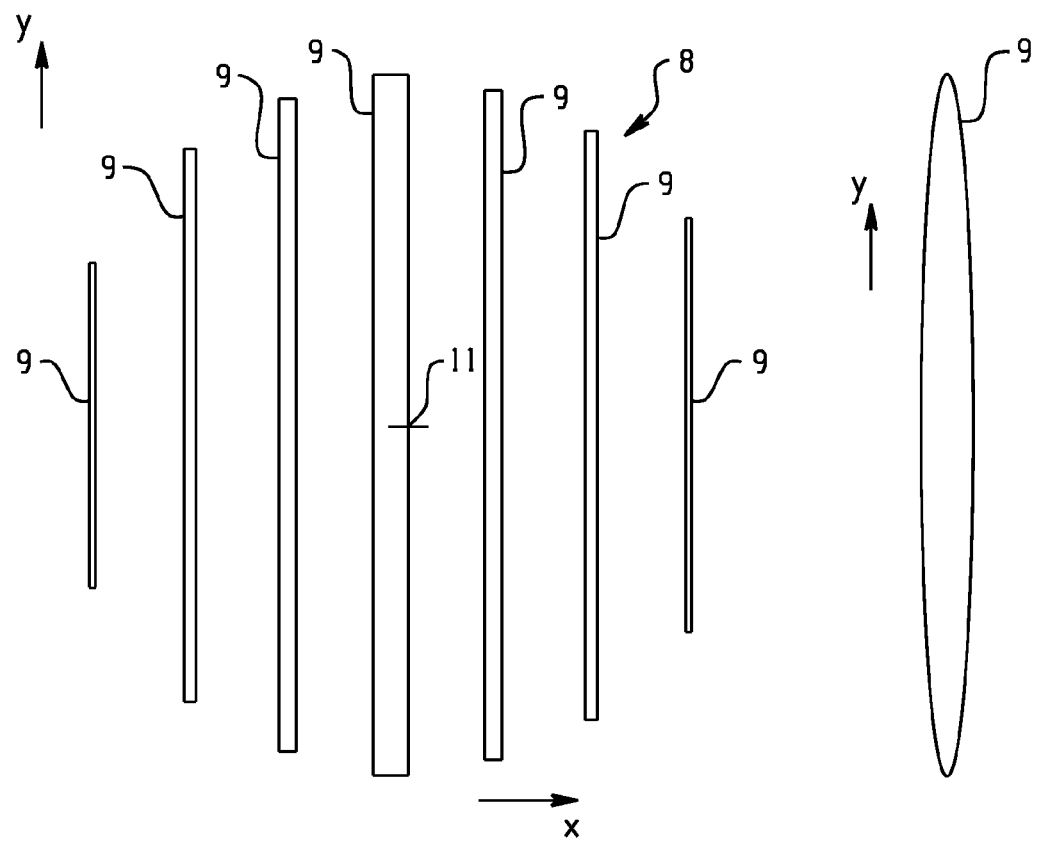
Fig. 5
Fig. 6

METHOD FOR PRODUCING A DIRECTIONAL LAYER BY CATHODE SPUTTERING, AND DEVICE FOR IMPLEMENTING THE METHOD

FIELD OF THE INVENTION

The invention relates to a method for producing a directional layer on a substrate surface by means of cathode sputtering, in each case with a nominal directionality in the tangent plane of that surface. Layers of that type are often magnetic layers, or support layers for magnetic layers featuring a preferred direction of magnetization. They are predominantly used in the memory modules of data processing systems, for instance in the read/write heads for hard disks and MRAMs. The invention further relates to a device for implementing the method.

PRIOR ART

A method of that category has been described earlier in U.S. Pat. No. 6,790,482 B2. It provides for a directional magnetic layer to be produced on a flat substrate and permitting easier magnetization in one specific, essentially constant, nominal direction (the so-called easy axis) than in other directions, especially those perpendicular to the nominal direction. For the orientation of the layer, electromagnets are positioned underneath the substrate so as to generate a magnetic field along whose lines of flux the particles impinging on the substrate surface will be magnetically aligned in a manner whereby the selected nominal direction extends parallel to the lines of electric flux.

That solution is not satisfactory for all applications, given the fact that the actual region-by-region orientation deviates rather significantly from the constant nominal direction usually desired. Moreover, the size and shape of the substrate are too limited to yield acceptable results.

A similar method, employing permanent magnets, is described in U.S. 2003/0 146 084 A1. In this case, a grounded collimator situated between the target and the substrate serves to limit the angle of incidence of particles on the substrate surface by intercepting particles whose angle deviates strongly from the surface normal, and to also keep the plasma clear of the substrate.

Another approach, similar to the method just outlined, has been described in WO 96/08 817 A1. It, too, employs a collimator whose aspect ratio serves to control parameters of the magnetic layer in such fashion that the crystal orientation extends either in the plane of the substrate surface or at a normal angle relative to the latter. In the former case, to be sure, no specific nominal directionality within that plane is sought.

U.S. Pat. No. 6,482,301 B1 describes yet another method of that type, whereby irregularities and magnetic anisotropism through the grazing incidence of particles on the substrate surface are prevented by means of a collimator.

SUMMARY OF THE INVENTION

It is the object of the invention to provide a generic method whereby it is possible, in simple and universally applicable fashion, to produce a directional layer on the surface of a substrate. This objective is achieved with the characterizing features specified in claim 1.

The invention provides a method by which a directional layer can be produced that will maintain a very flexibly selectable nominal directionality with substantial precision. That nominal directionality may for instance be constant or it may be radial from a central point. Many different forms of implementation are feasible. For example, the substrate and the target may be firmly connected or they may be movable relative to each other. Their relative position or movement can be selected or controlled, respectively, in a manner producing the inventive functionalities which, however, can also be achieved using mechanical screening. The additional use of magnetic fields for directional layer alignment is not excluded. It follows that the devices for implementing the method can be configured in greatly varied forms. In general, however, they can be of a relatively simple design. In many cases it is even possible to retrofit existing equipment, enabling it to implement the novel method according to the invention.

BRIEF DESCRIPTION OF THE DRAWINGS

The following will explain this invention in more detail with the aid of illustrations which merely represent embodiments and in which:

FIG. 4 is the schematic elevation of a device according to the invention, representing a second embodiment;

FIG. 5 is a schematic top view of the screening system of the device per FIG. 4;

FIG. 6 shows an element of the screening system in a special design version;

DESCRIPTION OF THE PREFERRED EMBODIMENTS

Figure 1:
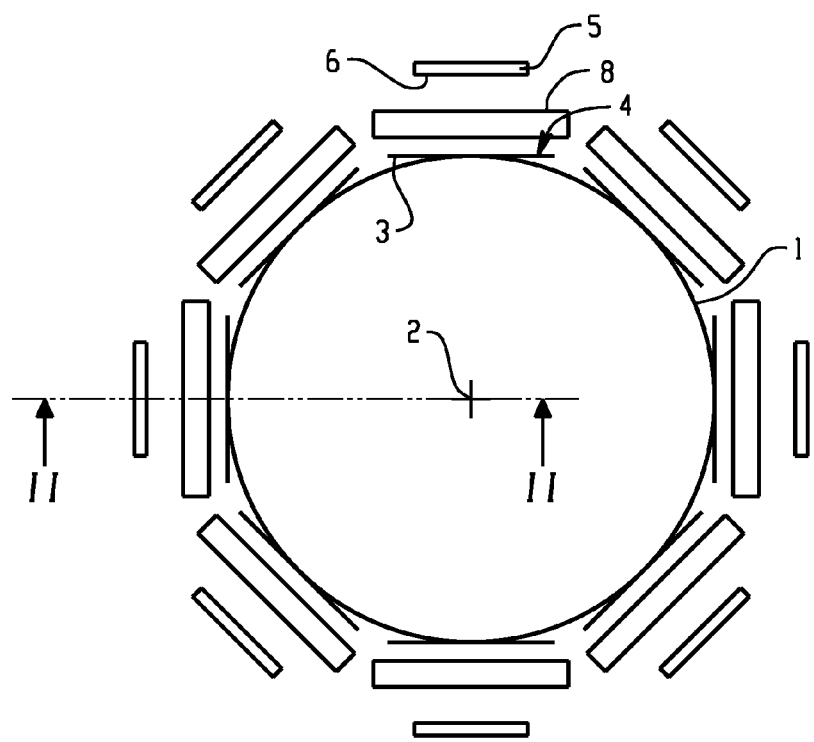
FIG. 1 is a schematic top view of a device according to the invention, representing a first embodiment.
Figures 2, 3:
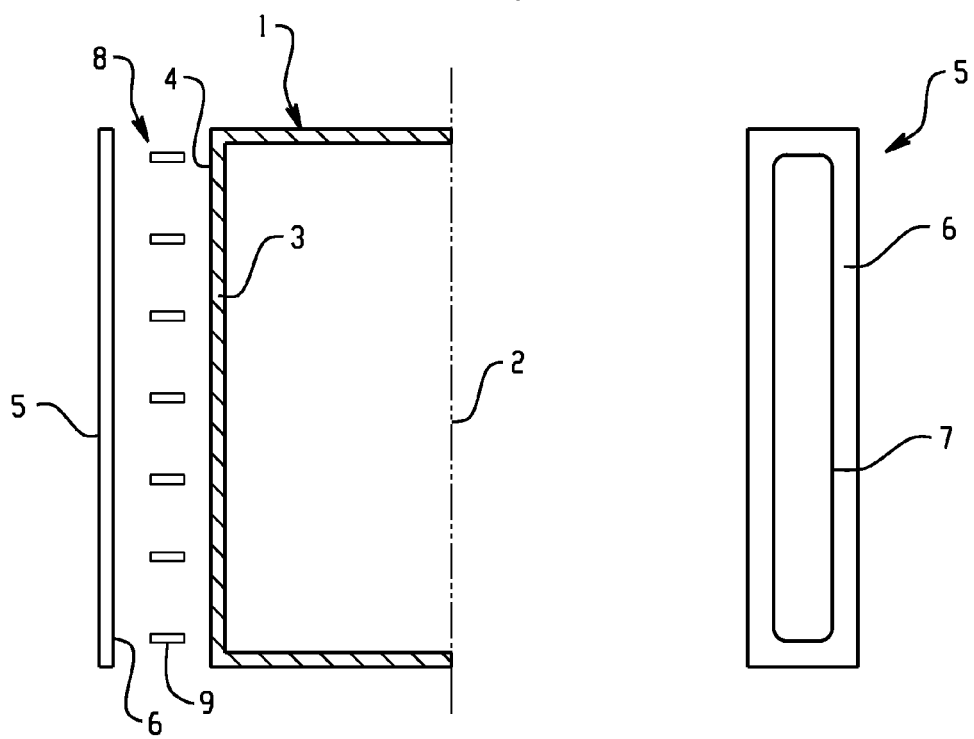
FIG. 2 is a section view along line II-II in FIG. 1.
FIG. 3 is the front view of a target of the device in FIGS. 1, 2.

The device shown in FIG. 1-3 is placed in a vacuum chamber (not shown). It features a cylindrical basket 1 that can pivot around an axis 2 and is provided on its outside with holders to which substrates 3 are attached, their flat substrate surfaces 4 facing outward. The substrates 3 may be disks with a diameter of about 200 mm, which, upon completion, will be cut up and used for instance in the fabrication of components for read/write heads. At a certain distance the basket 1 is surrounded by targets 5 in the form of elongated, vertical plates whose target surface 6 is oriented toward the axis 2. The targets 5 are constituted as conventional magnetron targets, meaning that behind the target surface 6 they are provided with magnets that generate in the region of the target surface 6 a magnetic field concentrated around a closed loop 7 (FIG. 3), causing the target 5 to be ablated primarily in that region, with corresponding erosion grooves produced in the target surface 6.

Positioned between each target 5 and the basket 1, somewhat closer to the substrate surface 4 than to the target surface 6, is a screening system in the form of a collimator 8 that is configured as a comb collimator with several rectangular, parallel plates 9, consisting for instance of aluminum, evenly and congruently spaced one above the other. The spacing between the target surface 6 and the substrate surface 4 may for instance be 75 mm, the spacing between the collimator 8 and the substrate surface 4, 30 mm, the length of the plates 9, 10 mm, and their spacing 50 mm.

A directional layer is produced on each of the substrate surfaces 4 by vapor-depositing target material on the substrates 3 in a cathode sputtering process during a given coating time and in essentially conventional fashion, while the basket 1 is rotated slowly and evenly for instance at a rate of 0.1 revolutions per second. That rotation in combination with the effect of the collimators 8 produces in each case a layer with a constant nominal directionality across the substrate surface 4, that directionality corresponding to the intersecting lines between the planes extending normal to the axis 2 and the substrate surface 4, which in the case here discussed makes it horizontal. This will be explained in more detail further below.

The ultimately desired result may perhaps be a low-retentivity layer on a substrate surface with a preferred direction of magnetization, i.e. a direction in which the layer can already be magnetized by means of a relatively small magnetic field (the so-called easy axis), whereas a direction at a normal angle thereto would require a substantially stronger magnetic field (the so-called hard axis). It is possible to use targets 5 essentially consisting of a low-retentivity material such as nickel-iron, for instance NiFe21, or cobalt-iron, so that the base layer, constituting the substrate surface 4, can be directly sputter-coated with the soft-magnetic material offering the preferred direction of magnetization. In most cases that will be the nominal direction, but a different directionality, typically normal to the nominal direction, may also be obtained by choosing a different material. Using a system as described above, a directional layer has been produced in which the maximum deviation of the nominal direction from the desired direction did not exceed 0.5°.

In another possible approach to producing on a substrate surface 4 a magnetic layer with a preferred direction of magnetization, the initial step is to vapor-deposit a directional support layer consisting for instance of chromium, vanadium or tungsten and then to coat that support layer with a layer of a magnetic material whose preferred direction of magnetization is determined by the nominal direction of the support layer, usually in that, depending on the material employed, it aligns itself parallel or normal to the latter. Applying the magnetic layer, usually again by cathode sputtering, does not require any particular steps for establishing a nominal directionality, although such steps may be additionally taken. In any case, where appropriate, it is possible to assist the formation of the preferred direction of magnetization in essentially conventional fashion by depositing the magnetic layer under a magnetic field that is effective in the region of the substrate surface 4 in which for instance its projection onto the substrate surface at each destination point matches the preferred direction of magnetization.

FIG. 4 depicts another device according to this invention. In this case, the substrate 3 is placed in a stationary position on the bottom of a vacuum chamber 10 with the plane substrate surface 4 pointing upward. A target 5 is mounted on the ceiling of the vacuum chamber 10 with its target surface 6 facing the substrate 3. The substrate 3 and the target 5 are disk-shaped. The magnets, again positioned behind the target surface 6, can be rotated. Located between the target 5 and the substrate 3 is a screening system which is again in the form of a collimator 8. The collimator 8 is again configured as a comb collimator composed of mutually parallel, plane plates 9 (FIG. 5) which may again consist of aluminum and extend in a direction perpendicular, in this case vertical, relative to the substrate surface 4. Parallel to the substrate surface 4 they are aligned in a Y-direction. The spacing between successively neighboring plates 9 in the X-direction that extends at a normal angle to the Y-direction and parallel to the substrate plane preferably increases slowly from the center toward the outer edges. The plates 9 may be of different length or average length and/or thickness or average thickness, preferably with their length and/or thickness progressively tapering off from a central point toward both outer ends in the X-direction. Where the thickness of the individual plate 9 changes across its surface, in particular in the Y-direction which extends parallel to the target surface 4, that change is again preferably a tapering off of the thickness from the center to the outer edges, as shown in FIG. 6.

The collimator 8 can be rotated relative to the substrate 3 around a central axis 11, where it is usually easier to pivot-mount the substrate 3 and to attach the collimator 8 in a fixed position. The plates 9 are so placed that, with the exception of a peripheral plate, each of the plates 9 can be moved, by a 180° rotation of the collimator 8 that shifts it from a first into a second position, to a point that is located roughly in the middle between two points where prior to the said rotation neighboring plates 9 had been positioned, whereby the points occupied by the plates 9 in the first position of the collimator 8 are vacated upon its shift into the second position. This can only be done with precision in the case of equidistant spacing between neighboring plates 9, as shown in FIG. 5, but it is also attainable with reasonable accuracy in the preferred case of a gradual outward increase in the inter-plate spacing.

A directional layer with a constant nominal directionality corresponding to the Y-axis on the substrate surface 4 is again produced by conventional cathode sputtering, with the target material in this case ablated primarily along a heart-shaped loop on the target surface 6. The described configurations of the plates 9 can to a large extent prevent thickness variations of the directional layer, which would otherwise result from the asymmetric structure of the system, in that a broadening of the preferred angular range compensates for lesser local particle densities. A shifting of the collimator 8, also described above, perhaps after half the coating time has elapsed, will serve the same purpose equalizing the shadowing effect of the plates 9.

However, the method according to this invention can be employed in a broader range of applications than the above-described examples would suggest. For example, even curved substrate surfaces can be coated and the nominal directionality may be a—preferably continuous—function of the site, i.e. of the destination point. As the decisive factor in each case, the incidence of particles on the substrate surface must be controlled in a way that, averaged over the coating period, the sum total of those incident vectors dominates whose projection onto the tangent area of the substrate surface—coinciding with the latter in the case of a plane substrate surface—is in line with the nominal direction at the destination point. The nominal direction in this case is defined as a sign-neutral parameter, i.e. it does not matter whether the incidence originates from one side or from the other.

When the density of the particle incidence rate at a destination point is represented by $\rho(\theta, \phi, t)$, where $\theta$ describes the angle of the direction of incidence relative to normal on the substrate surface 4 and $\phi$ is the angle between the projection of the direction of incidence onto the tangent plane and a fixed direction in the latter, the incidence density integrated over the total coating time T as a directional function will be $$\chi(\theta, \phi) = \int_0^T \rho(\theta, \phi, t)dt, \; 0 \leq \theta < \pi/2, \; 0 \leq \phi < 2\pi \quad (1)$$

Figure 7A:
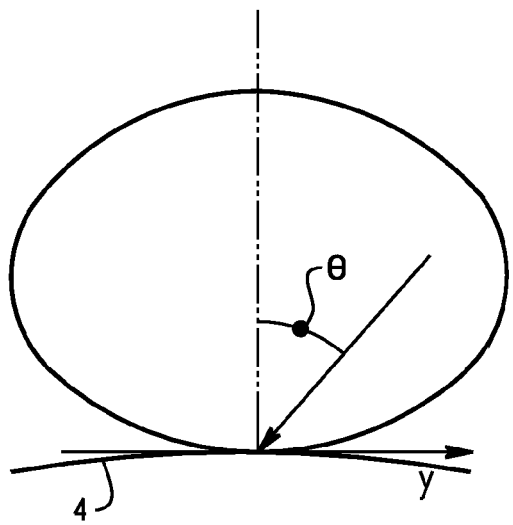
FIG. 7a represents a section through an incident lobe at the destination point of a substrate surface parallel to a nominal direction.
Figure 7B:
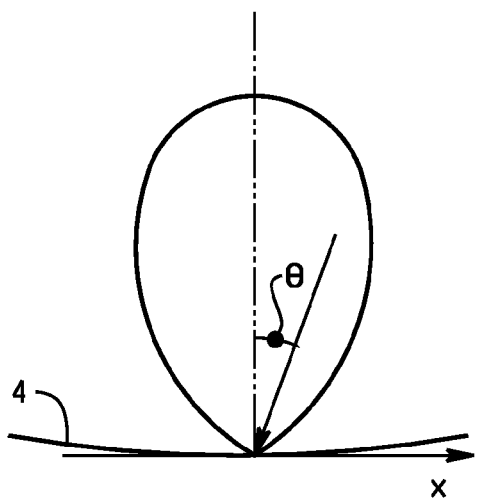
FIG. 7b represents a section through the incident lobe perpendicular to the nominal direction.
Figure 8:
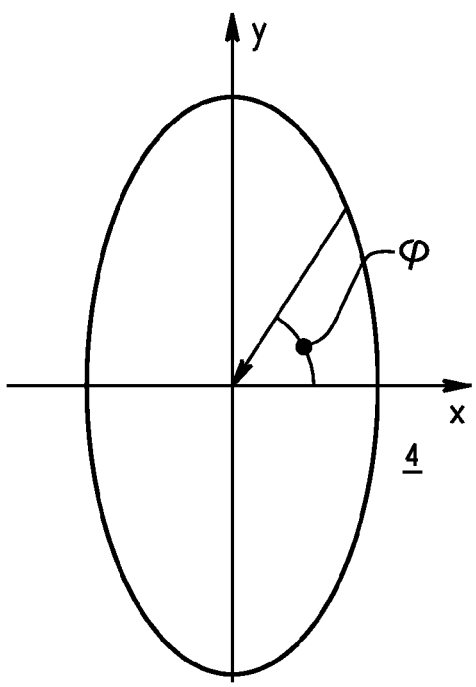
FIG. 8 shows the cumulative particle incidence at the destination point as a function of the directionality in the tangent plane.

This function is shown in FIG. 7a,b in two cross-sectional views perpendicular to the tangent plane of the substrate surface 4, where the Y-direction is the nominal direction and the X-direction extends at a normal angle to it. However, what ultimately determines the nominal direction in the tangent plane is a cumulative density of incidence, i.e., a weighted sum total over the range of the angle θ that reflects the slope of the incidence, hence:

$$R(\phi) = \int_0^{\pi/2} \chi(\theta, \phi) w(\theta) d\theta, \; 0 \leq \phi < 2\pi \quad (2)$$

where w(θ) is a function of weight which may for instance be proportional to sin θ, i.e. to the relative length of the normal projection onto the tangent plane. R(φ) is shown in FIG. 8. The function has its maxima at the point where φ corresponds to the nominal direction since the particle incidence has been specifically controlled in such fashion that the projection of the direction of incidence is primarily focused on or limited to an angular range, encompassing the nominal direction, for instance of ±π/4. Since the nominal direction is defined as a sign-neutral variable, it basically suffices for $R_S(\phi) = R(\phi) + R(\phi + \pi), \; 0 \leq \phi < \pi$ to have a maximum at that point; however, as a rule, R is at least approximately mirror-symmetric.

There are two preferred ways to control the particle incidence on the substrate surface 4, one being the use of mechanical screening elements such as the collimator 8, the other being the adjustment or control of the relative position of the substrate and the target. For example, the substrate can move relative to the target or targets in a manner whereby certain directions of incidence, whose projection onto the tangent plane is close to the nominal direction, predominate. Such movement may even be irregular and/or intermittent, while in addition it is possible to specifically alter the output of the device, meaning the density of the particle flow emanating from the target, by changing the position of the substrate relative to the target for instance in such fashion that it is particularly high when the predominantly grazing particle incidence is parallel to the nominal direction. As shown in the first embodiment per FIG. 1-3, both approaches can be combined, for instance by slowing or stopping the rotation of the basket 1 when the substrates 3 are positioned approximately in the middle between two neighboring targets 5 while in addition the device output may be increased.

The screening elements should in that case be so configured and positioned that the paths of the particles, along essentially straight lines that connect a point on the target surface with the destination point on the substrate surface, collide with the screening element, meaning that the particles are intercepted if they would otherwise impinge on the destination point from a direction whose projection onto the tangent plane lies outside the preferred angular range. This should at least be the case for the mean taken over the coating time and the weighted mean over the slope of incidence, i.e. the angle θ. In this context it may also be necessary to take the fact into account that the target surface has variably active regions, with the majority of particles originating from a relatively small area, for instance from the surrounding region of the loop 7 in the first embodiment.

In addition, as mentioned above, it is possible to apply a magnetic field in the area of the substrate, but in most cases that would not be necessary.

List of Reference Symbols 1 basket
2 axis
3 substrate
4 substrate surface
5 target
6 target surface
7 loop
8 collimator
9 plate
10 vacuum chamber
11 axis

What is claimed is:

1. A device for producing a directional layer on a plane substrate surface of a substrate with a constant nominal directionality in the plane substrate surface by means of cathode sputtering, with a vacuum chamber where at least one target is placed and which contains at least one holder suitable for attaching the substrate in such fashion that the plane substrate surface faces a surface of the at least one target, and at least one collimator placed between the target surface and the holder, the collimator consisting essentially of plane plates which are parallel to one another and aligned in a direction normal to the plane substrate surface, where an average length of the plates in the direction normal to the plane substrate surface decreases from a center of the collimator toward outer ends thereof, where a location of the collimator relative to a location of the holder can be switched between two positions such that, in one of the positions, each of the plates occupies a point that is vacant in an other one of the positions, an orientation of the plates being equivalent in both of the positions, and where, in the one of the positions of the collimator, each of the plates, with an exception of one of two end plates, occupies a location approximately situated in a middle between two points that, in the other one of the positions, are occupied by the plates.

2. The device of claim 1, where the collimator can be moved into the other one of the positions by half a rotation relative to the planar substrate surface about an axis directed toward the planar substrate surface.

3. The device of claim 1, where the holder can be moved relative to the target surface parallel to the plates.

4. A method for applying, on a plane substrate surface, a magnetic layer with a constant preferred direction of magnetization parallel to the plane substrate surface, comprising:
   placing at least one target in a vacuum chamber of a sputtering device;
   attaching the substrate to at least one holder suitable for the substrate;
   positioning a collimator consisting essentially of plane plates which are parallel to one another and aligned in a direction normal to the plane substrate surface between the target surface and the holder in such fashion that the plane substrate surface faces a surface of the at least one target and at least one collimator placed between the target surface and the holder; an average length of the plates in a direction normal to the plane substrate surface decreases from a center of the collimator toward outer ends thereof; and a thickness of at least part of the plates changes in a horizontal direction that is parallel to the substrate surface so that the thickness decreases from a center point of the at least part of the plates toward outer edge of the collimator;
   collimating one or more particles from the at least one target using the collimator; and producing a directional layer of a substrate with a constant nominal directionality.

5. The method of claim 4, where the directional layer is the magnetic layer having the preferred direction of magnetization that corresponds to the nominal direction.

6. The method of claim 4, where the directional layer is a support layer on which the magnetic layer is subsequently applied, the magnetic layer having a preferred direction of magnetization determined by a nominal direction of the support layer.

7. The method according to claim 4, wherein the preferred direction of magnetization is determined by the nominal directionality and a magnetic material employed in the sputtering.

8. A device for producing a directional layer on a plane substrate surface of a substrate with a constant nominal directionality in the plane substrate surface by means of cathode sputtering, with a vacuum chamber where at least one target is placed and which contains at least one holder suitable for attaching the substrate in such fashion that the plane substrate surface faces a target surface of the at least one target and where at least one collimator is placed between the target surface and the holder, the collimator consisting essentially of plane plates which are parallel to one another and aligned in a direction normal to the plane substrate surface and an average length of the plates decreasing from the center of the collimator toward outer ends thereof, and wherein the collimator can be switched between two positions relative to the holder, with an orientation of the plates equivalent in both of the positions, and wherein in the one of the positions of the collimator each of the plates, with an exception of one of two end plates, occupies a location approximately situated in a middle between two points that, in the other one of the positions, are occupied by the plates.

9. The device of claim 8, wherein for at least part of the plates a thickness changes parallel to the substrate surface in that said thickness decreases from a center point of each plate toward outer edges.

10. The device of claim 8, wherein each of the plates of the collimator occupies in each of the two positions a point that is vacant in the other one of the two positions.

11. The device of claim 1, wherein for at least part of the plates a thickness changes parallel to the substrate surface in that said thickness decreases from a center point of each plate toward outer edges.

12. The method of claim 4, wherein the collimator is made of aluminum.

13. A method for applying, on a plane substrate surface, a magnetic layer with a constant preferred direction of magnetization parallel to the plane substrate surface, comprising:

placing at least one target in a vacuum chamber of a sputtering device;

attaching the substrate to at least one holder suitable for the substrate;

positioning a collimator consisting essentially of plane plates which are parallel to one another and aligned in a direction normal to the plane substrate surface between the target surface and the holder in such fashion that the plane substrate surface faces a surface of the at least one target and at least one collimator placed between the target surface and the holder; an average length of the plates in a direction normal to the plane substrate surface decreases from a center of the collimator toward outer ends thereof; and a thickness of at least part of the plates changes in a horizontal direction that is parallel to the substrate surface;

collimating one or more particles from the at least one target using the collimator; and producing a directional layer of a substrate with a constant nominal directionality.

14. A device for producing a directional layer on a plane substrate surface of a substrate with a constant nominal directionality in the plane substrate surface by means of cathode sputtering, comprising:

a vacuum chamber, at least one target placed in the vacuum chamber, at least one holder for attaching the substrate to the at least one holder, and at least one collimator placed between the target surface and the holder, the collimator consisting essentially of plane plates which are parallel to one another and aligned in a direction normal to the plane substrate surface, wherein the plane substrate surface faces a surface of the at least one target, wherein an average length of the plane plates in the direction normal to the plane substrate surface decreases from a center of the collimator toward outer ends thereof, and wherein a thickness of at least part of the plane plates changes in a horizontal direction that is parallel to the substrate surface.

15. The device of claim 14, wherein for at least part of the plane plates a thickness changes in the horizontal direction in that said thickness decreases from a plate in the center point toward a plate at the outer edges.

* * * * *